(12) United States Patent
Takahashi

(10) Patent No.: US 9,112,134 B2
(45) Date of Patent: Aug. 18, 2015

(54) RESONATOR, FREQUENCY FILTER, DUPLEXER, ELECTRONIC DEVICE, AND METHOD OF MANUFACTURING RESONATOR

(71) Applicant: TAIYO YUDEN CO., LTD., Tokyo (JP)

(72) Inventor: Tomoyuki Takahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 202 days.

(21) Appl. No.: 13/777,038

(22) Filed: Feb. 26, 2013

(65) Prior Publication Data

US 2013/0234805 A1    Sep. 12, 2013

(30) Foreign Application Priority Data

Mar. 7, 2012  (JP) ................... 2012-050157
Dec. 20, 2012 (JP) ................... 2012-278237

(51) Int. Cl.

| H03H 9/00 | (2006.01) |
|---|---|
| H01L 41/047 | (2006.01) |
| H03H 9/54 | (2006.01) |
| H03H 9/58 | (2006.01) |
| H01L 41/29 | (2013.01) |
| H03H 9/02 | (2006.01) |
| H03H 3/02 | (2006.01) |
| H03H 9/60 | (2006.01) |

(52) U.S. Cl.
CPC .............. *H01L 41/047* (2013.01); *H01L 41/29* (2013.01); *H03H 9/02228* (2013.01); *H03H 9/54* (2013.01); *H03H 9/58* (2013.01); *H03H 9/605* (2013.01); *H03H 2003/021* (2013.01); *Y10T 29/42* (2015.01)

(58) Field of Classification Search
CPC ..................................................... H01L 41/047
USPC ...... 310/313 R, 313 B, 313 A, 348, 320, 340, 310/344; 333/193–194, 186–188
See application file for complete search history.

(56) References Cited

U.S. PATENT DOCUMENTS

| 7,535,152 | B2 * | 5/2009 | Ogami et al. ............. 310/313 A |
| 7,965,015 | B2 * | 6/2011 | Tai et al. ................... 310/313 R |
| 8,035,464 | B1 * | 10/2011 | Abbott et al. ................. 333/193 |
| 8,476,809 | B2 * | 7/2013 | Chen et al. ..................... 310/344 |
| 8,581,477 | B2 * | 11/2013 | Suenaga et al. ............... 310/358 |
| 2002/0063497 | A1 * | 5/2002 | Panasik ......................... 310/364 |
| 2007/0188047 | A1 | 8/2007 | Tanaka |

FOREIGN PATENT DOCUMENTS

JP    2007-251910 A    9/2007

* cited by examiner

*Primary Examiner* — Dinh Le
(74) *Attorney, Agent, or Firm* — Chen Yoshimura LLP

(57) ABSTRACT

A resonator according to the present invention includes a supporting substrate, a piezoelectric layer, a pair of excitation electrodes, and a bonding layer. The piezoelectric layer is made of a piezoelectric material. The pair of excitation electrodes is formed on the upper surface of the piezoelectric layer so as to excite bulk acoustic waves. The bonding layer has a cavity formed therein so as to face the excitation electrode pair through the piezoelectric layer, and the bonding layer bonds the supporting substrate to the lower surface of the piezoelectric layer.

7 Claims, 11 Drawing Sheets

|  | Transmission (Tx) Range | Reception (Rx) Range |
|---|---|---|
| Impedance Conditions | $Zt = Z0 \ll Zr$ | $Zr = Z0 \ll Zt$ |

FIG. 12

RESONATOR, FREQUENCY FILTER, DUPLEXER, ELECTRONIC DEVICE, AND METHOD OF MANUFACTURING RESONATOR

This application claims the benefit of Japanese Application No. 2012-050157, filed in Japan on Mar. 7, 2012, which is hereby incorporated by reference in its entirety.

The present application also claims the benefit of Japanese Application No. 2012-278237, filed in Japan on Dec. 20, 2012, which is hereby incorporated by reference in its entirety.

BACKGROUND OF THE INVENTION

1. Field of the Invention

The present invention relates to a resonator, a frequency filter, a duplexer, and an electronic device that utilize bulk acoustic waves in a piezoelectric layer, and to a method of manufacturing a resonator.

2. Description of Related Art

When an electric field is applied to a piezoelectric element, elastic waves can be generated. Elastic waves include surface acoustic waves (SAW) that propagate along a surface of the piezoelectric element, bulk acoustic waves (BAW) that propagate inside the piezoelectric element, and the like, and the bulk acoustic waves include Lamb waves that propagate as longitudinal waves and transverse waves.

A resonator is an element that utilizes such elastic waves in the piezoelectric element, and is provided with a piezoelectric layer formed on a substrate and an electrode such as a comb-shaped electrode (IDT: inter-digital transducer) formed on the piezoelectric layer. When the electrode is applied with an electric signal, elastic waves are generated in the piezoelectric layer. When elastic waves in the piezoelectric layer reach the electrode, an electric signal can be obtained. The frequency of elastic waves that resonate with the electrode can be controlled by the thickness of the piezoelectric layer and a pitch of the comb-shaped electrode.

Due to such characteristics, a resonator can be used as a frequency filter that allows signals having a specific frequency to pass through, and is widely used in a duplexer that divides reception signals and transmission signals in a communication apparatus.

Among elastic waves, the bulk acoustic waves propagate inside the piezoelectric layer, and therefore, a free vibration surface that allows the piezoelectric layer to vibrate needs to be provided on the side opposite to the electrode, that is, at the boundary between the piezoelectric layer and the substrate. For example, in the "Lamb wave high-frequency device" disclosed in Patent Document 1, the reinforcing substrate has a recess formed therein, thereby providing a free vibration surface for the piezoelectric layer.

RELATED ART DOCUMENT

Patent Document

Patent Document 1: Japanese Patent Application Laid-Open Publication No. 2007-251910 (paragraph [0053] and FIG. 2)

SUMMARY OF THE INVENTION

However, the element structure in which the supporting substrate of the piezoelectric layer has a recess formed therein as described in Patent Document 1 has a problem of requiring an additional manufacturing step to form a recess in the supporting substrate and a problem of reducing the mechanical strength of the element as compared with a case in which a supporting substrate having no recess. Especially with increasing demands for further size reduction in these elements, the above-mentioned problems need to be solved from the perspective of increasing productivity.

In view of the above situations, the present invention is aiming at providing a resonator, a frequency filter, a duplexer, and an electronic device that do not require processing on a supporting substrate, and a method of manufacturing a resonator.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a resonator that includes:

a supporting substrate;

a piezoelectric layer made of a piezoelectric material;

a pair of excitation electrodes that is formed on an upper surface of the piezoelectric layer, the pair of excitation electrodes being provided to excite bulk acoustic waves in the piezoelectric layer; and a bonding layer that has a cavity formed therein so as to face the pair of excitation electrodes through the piezoelectric layer, the bonding layer being provided to bond the supporting substrate to a lower surface of the piezoelectric layer.

In another aspect, the present invention provides a frequency filter that includes:

a supporting substrate;

a piezoelectric layer made of a piezoelectric material;

a plurality of pairs of excitation electrodes that are formed on an upper surface of the piezoelectric layer, the plurality of pairs of excitation electrodes being provided to excite bulk acoustic waves in the piezoelectric layer; and a bonding layer that has a cavity formed therein so as to face each of the pairs of excitation electrodes through the piezoelectric layer, the bonding layer being provided to bond the supporting substrate to a lower surface of the piezoelectric layer.

In another aspect, the present invention provides a duplexer that includes:

a transmission filter that includes: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the transmission filter being connected to an antenna and to a transmission port; and a reception filter that includes: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the reception filter being connected to the antenna and to a reception port.

In another aspect, the present invention provides an electronic device that includes:

an antenna;

a transmission filter that includes: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the transmission filter being connected to the antenna and to a transmission port; and a reception filter that includes: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the reception filter being connected to the antenna and to a reception port.

In another aspect, the present invention provides a method of manufacturing an electronic device, the method including:

forming a sacrificial layer on a lower surface of a piezoelectric layer made of a piezoelectric material;

bonding a supporting substrate to the lower surface of the piezoelectric layer by an adhesive such that the sacrificial layer is interposed therebetween;

forming a pair of excitation electrodes that can excite bulk acoustic waves in the piezoelectric layer on an upper surface of the piezoelectric layer so as to face the sacrificial layer; and removing the sacrificial layer.

It is to be understood that both the foregoing general description and the following detailed description are exemplary and explanatory, and are intended to provide further explanation of the invention as claimed.

BRIEF DESCRIPTION OF THE DRAWINGS

FIG. 12 is a table showing impedance conditions of a transmission filter and a reception filter.

DETAILED DESCRIPTION OF THE PREFERRED EMBODIMENTS

Figure 1:
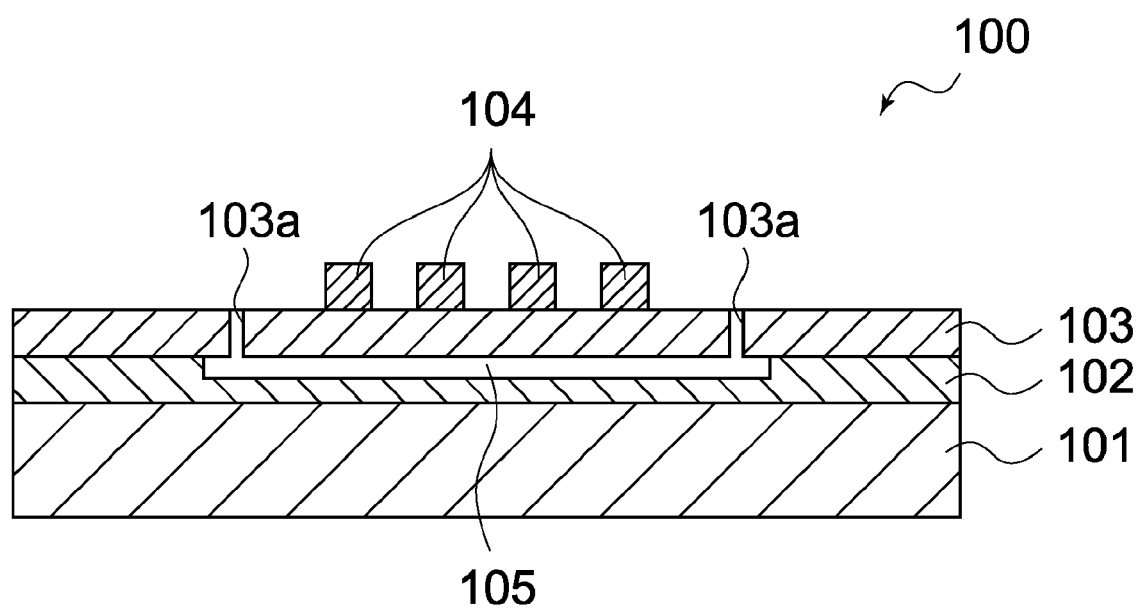
FIG. 1 is a cross-sectional view showing a layered structure of a resonator according to an embodiment of the present invention.

A resonator according to an embodiment of the present invention includes a supporting substrate, a piezoelectric layer, a pair of excitation electrodes, and a bonding layer. The piezoelectric layer is made of a piezoelectric material. The excitation electrode pair is formed on an upper surface of the piezoelectric layer, and excites bulk acoustic waves in the piezoelectric layer. The bonding layer has a cavity formed therein so as to face the excitation electrode pair through the piezoelectric layer, and bonds the supporting substrate to a lower surface of the piezoelectric layer.

With this configuration, a free vibration surface that allows the piezoelectric layer to vibrate is provided by a cavity formed in the bonding layer, thereby eliminating a need to process the supporting substrate. Therefore, it is possible to prevent the mechanical strength and the productivity from being reduced as a result of processing the supporting substrate, and it is also possible to reduce the size of the resonator.

The bulk acoustic waves may be Lamb waves.

The appropriate thickness of the piezoelectric layer to cause the Lamb waves to propagate is significantly smaller than the appropriate thickness of the piezoelectric layer to cause surface acoustic waves to propagate. Therefore, in a resonator that utilizes the Lamb waves, the strength of the supporting substrate has greater importance. As described above, in the resonator of this embodiment, the strength of the supporting substrate is prevented from being reduced, and therefore, it is suitably used for the Lamb waves.

The bonding layer may be made of an insulating material.

In the structure of the resonator of this embodiment, it is necessary to provide electrical insulation between the piezoelectric layer and the supporting substrate. By forming the bonding layer of an insulating material, the bonding layer can electrically isolate the two elements from each other. That is, it is not necessary to provide an additional layer for insulation, which is preferable from the perspectives of productivity and size reduction of a resonator.

The excitation electrode pair may be an IDT.

The IDT (inter-digital transducer: comb-shaped electrodes) is a pair of electrodes, each of which is made of an electrically conductive material arranged in a comb shape and can excite Lamb waves. In the resonator of this embodiment, the IDT is formed on the piezoelectric layer, and can be used as excitation electrodes.

A frequency filter according to an embodiment of the present invention includes a supporting substrate, a piezoelectric layer, a plurality of pairs of excitation electrodes, and a bonding layer. The piezoelectric layer is made of a piezoelectric material. The pairs of excitation electrodes are formed on an upper surface of the piezoelectric layer, and excite bulk acoustic waves in the piezoelectric layer. The bonding layer has a cavity formed therein so as to face each pair of the excitation electrodes through the piezoelectric layer, and bonds the supporting substrate to a lower surface of the piezoelectric layer.

A duplexer according to an embodiment of the present invention includes a transmission filter and a reception filter. The transmission filter includes: a supporting substrate; a piezoelectric layer made of a piezoelectric material; a plurality of pairs of excitation electrodes that are formed on an upper surface of the piezoelectric layer, the pairs of excitation electrodes being provided to excite bulk acoustic waves in the piezoelectric layer and at least some of the excitation electrodes being connected to each other; and a bonding layer that has a cavity formed therein so as to face each pair of the excitation electrodes through the piezoelectric layer, the bonding layer being provided to bond the supporting substrate to a lower surface of the piezoelectric layer, and the transmission filter is connected to an antenna and to a transmission port. The reception filter includes: a supporting substrate; a piezoelectric layer made of a piezoelectric material; a plurality of pairs of excitation electrodes that are formed on an upper surface of the piezoelectric layer, the pairs of the excitation electrodes being provided to excite bulk acoustic waves in the piezoelectric layer and at least some of the excitation electrodes being connected to each other; and a bonding layer that has a cavity formed therein so as to face each pair of the excitation electrodes through the piezoelectric layer, the bonding layer being provided to bond the supporting substrate to a lower surface of the piezoelectric layer, and the reception filter is connected to the antenna and to a reception port.

An electronic device according to an embodiment of the present invention includes an antenna, a transmission filter, and a reception filter. The transmission filter includes: a supporting substrate; a piezoelectric layer made of a piezoelectric material; a plurality of pairs of excitation electrodes that are formed on an upper surface of the piezoelectric layer, the pairs of the excitation electrodes being provided to excite bulk acoustic waves in the piezoelectric layer and at least some of the excitation electrodes being connected to each other; and a bonding layer that has a cavity formed therein so as to face each pair of the excitation electrodes through the piezoelectric layer, the bonding layer being provided to bond the supporting substrate to a lower surface of the piezoelectric layer, and the transmission filter is connected to the antenna and to a transmission port. The reception filter includes: a supporting substrate; a piezoelectric layer made of a piezoelectric material; a plurality of pairs of excitation electrodes that are formed on an upper surface of the piezoelectric layer, the pairs of excitation electrodes being provided to excite bulk acoustic waves in the piezoelectric layer and at least some of the excitation electrodes being connected to each other; and a bonding layer that has a cavity formed therein so as to face each pair of the excitation electrodes through the piezoelectric layer, the bonding layer being provided to bond the supporting substrate to a lower surface of the piezoelectric layer, and the reception filter is connected to the antenna and to a reception port.

In a method of manufacturing an electronic device according to an embodiment of the present invention, a sacrificial layer is formed on a lower surface of a piezoelectric layer made of a piezoelectric material. A supporting substrate and a lower surface of the piezoelectric layer are bonded to each other by an adhesive such that the sacrificial layer is interposed therebetween. On an upper surface of the piezoelectric layer, a pair of excitation electrodes that can excite bulk acoustic waves in the piezoelectric layer is formed so as to face the sacrificial layer. The sacrificial layer is removed.

In this manufacturing method, the piezoelectric layer and the supporting substrate are bonded to each other by an adhesive after the sacrificial layer is formed on the lower surface of the piezoelectric layer. Therefore, an adhesive is not interposed between the piezoelectric layer and the sacrificial layer. As a result, when the sacrificial layer is removed and a cavity is formed, no adhesive is present on the lower surface of the piezoelectric layer that faces the cavity, i.e., on the free vibration surface, and therefore, it is possible to prevent the adhesive from affecting resonance characteristics.

The process of removing the sacrificial layer may include a step of forming a penetrating hole in the piezoelectric layer so as to reach the sacrificial layer, and a step of injecting a solution that dissolves the sacrificial layer into the penetrating hole.

With this manufacturing method, it is possible to remove the sacrificial layer, which is interposed between the layers, with ease.

(Mechanism and Features of Resonator)

The mechanism and features of a resonator that utilizes bulk acoustic waves in a piezoelectric layer will be explained.

Figure 6:
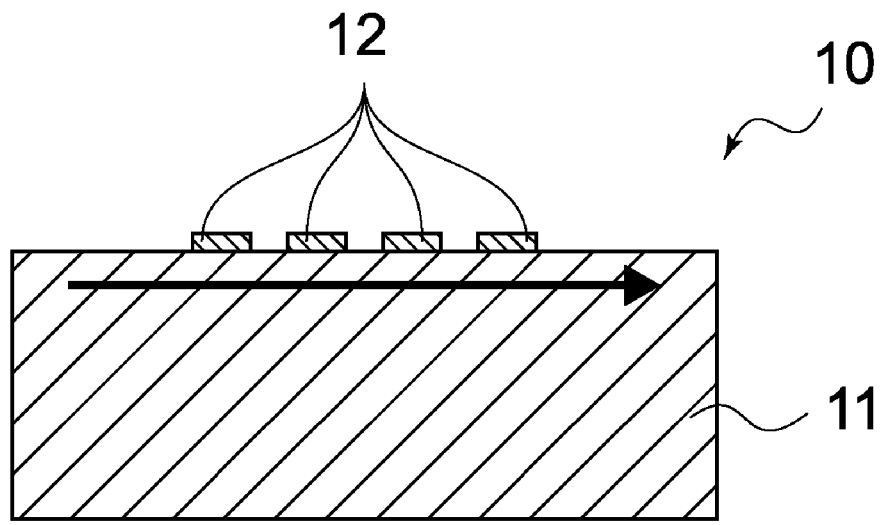
FIG. 6 is a diagram that schematically shows a structure of a SAW device.

SAW (surface acoustic wave) is a type of elastic waves, and propagates along a surface of piezoelectric crystals. FIG. 6 is a schematic diagram showing a structure of a SAW device 10. A comb-shaped electrode pair (IDT) 12 is formed on the upper surface of a piezoelectric substrate 11 made of piezoelectric crystals. When an AC voltage is applied, SAW having a frequency that corresponds to the propagation speed of SAW and the electrode pitch is excited as a result of the reverse piezoelectric effect. The propagation direction of elastic waves is indicated with the arrow in this figure (also in the other figures below). Although it is technically possible to increase the resonance frequency of the SAW device to a higher frequency by having a very fine electrode pitch, the SAW device is not suitable for a high frequency range due to a processing technique of the electrodes and power durability.

Figure 7:
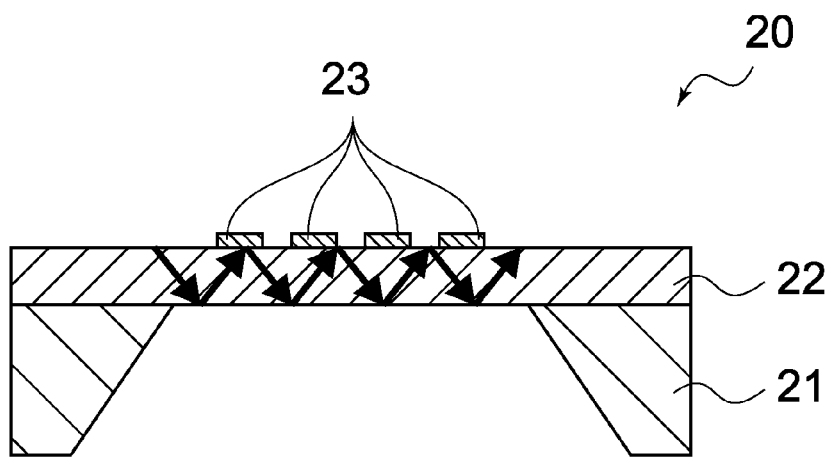
FIG. 7 is a diagram that schematically shows a structure of a Lamb wave device.

Lamb waves are also elastic waves, but unlike the SAW, Lamb waves propagate inside a thin piezoelectric crystal plate. FIG. 7 is a schematic diagram showing a structure of a Lamb wave device 20. In this device structure, a piezoelectric layer 22 is formed on an Si substrate 21, and the free end for vibration is provided by removing a part of the Si substrate 21 on the lower surface side or the like. In a manner similar to the SAW device, an IDT 23 is formed on the upper surface to excite the Lamb waves when applied with an AC voltage. The resonance frequency is determined by the electrode pitch and the propagation speed of the Lamb waves. It is possible to use this device for a high frequency range by having a very small electrode pitch and reducing the plate thickness. Because the propagation speed of the Lamb waves is much faster than that of the SAW, it is easier to make the Lamb wave device for a high frequency range.

Figure 8:
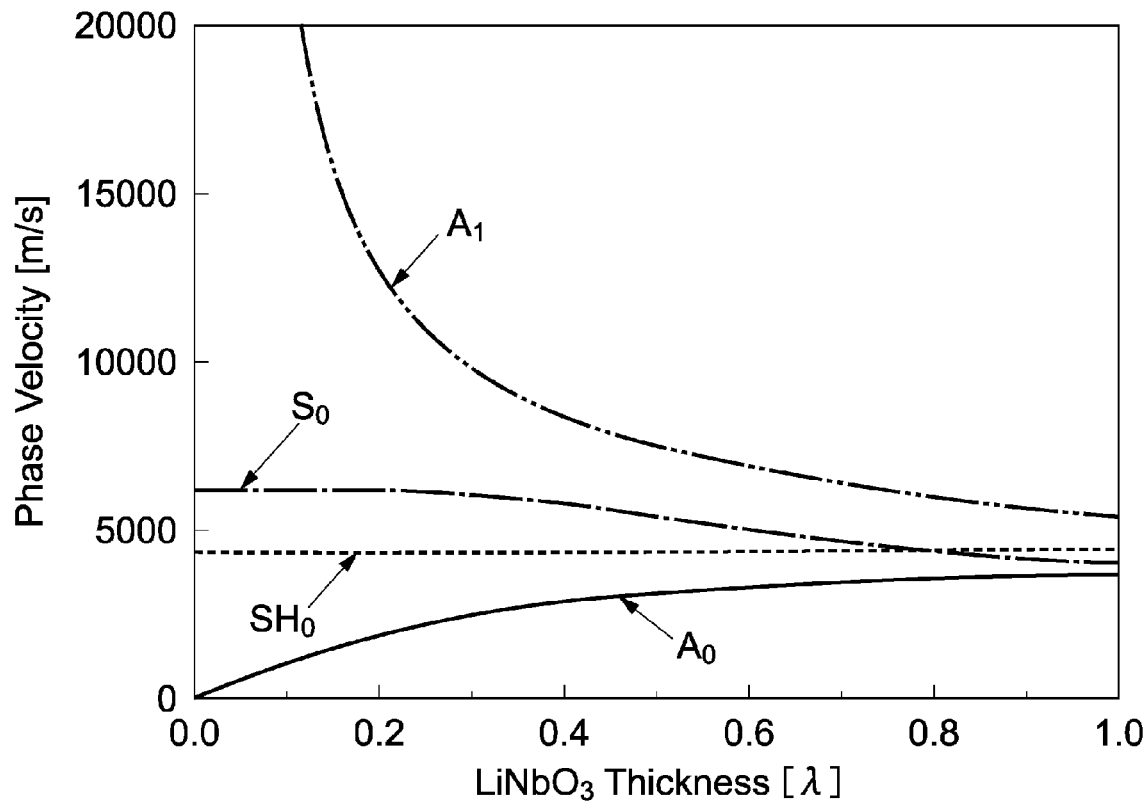
FIG. 8 is a graph showing a dispersion relation between the thickness of an $LiNbO_3$ single-crystal substrate and the phase velocity in each mode.

As described above, there are many modes in the Lamb waves, and the coupling coefficients and dispersion relations thereof are mutually different in the respective modes. FIG. 8 is a graph (calculated values) showing a dispersion relation between the thickness of an $LiNbO_3$ single crystal substrate (normalized with the wavelength) and the phase velocity of each mode. For example, the IDT pitch and the resonance frequency in the case of fabricating a resonator by employing A1 mode will be explained. When an LN substrate with a thickness of 400 nm is used, and the IDT pitch is set to 1 μm, the wavelength λ of A1 mode that is excited is derived as IDT pitch×2=2 μm. The normalized thickness is 400 nm/2

μm=0.2, and from the dispersion curve of the A1 mode, the phase velocity V is derived as about 13000 m/s. The resonance frequency f0 is represented as f0=v/λ, and when v and λ are substituted, f0=6.5 GHz is obtained.

Figure 9:
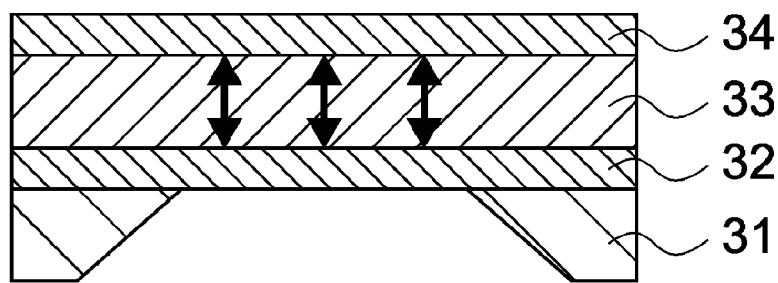
FIG. 9 is a diagram that schematically shows a structure of an FBAR device.

An FBAR (film bulk acoustic resonator) is a resonator that utilizes vibrations in a piezoelectric thin film in the thickness direction. FIG. 9 is a schematic diagram showing a structure of an FBAR device 30. The FBAR device 30 is made of a lower electrode 32, a piezoelectric layer 33, and an upper electrode 34 laminated in this order on a substrate 31. It is necessary to provide a free end for vibrations, and therefore, a cavity is formed in a lower part of the resonator by employing a method of removing a lower part of the resonator from the side of the lower surface of the substrate 31, a method of using a sacrificial layer, or the like.

Figure 10:
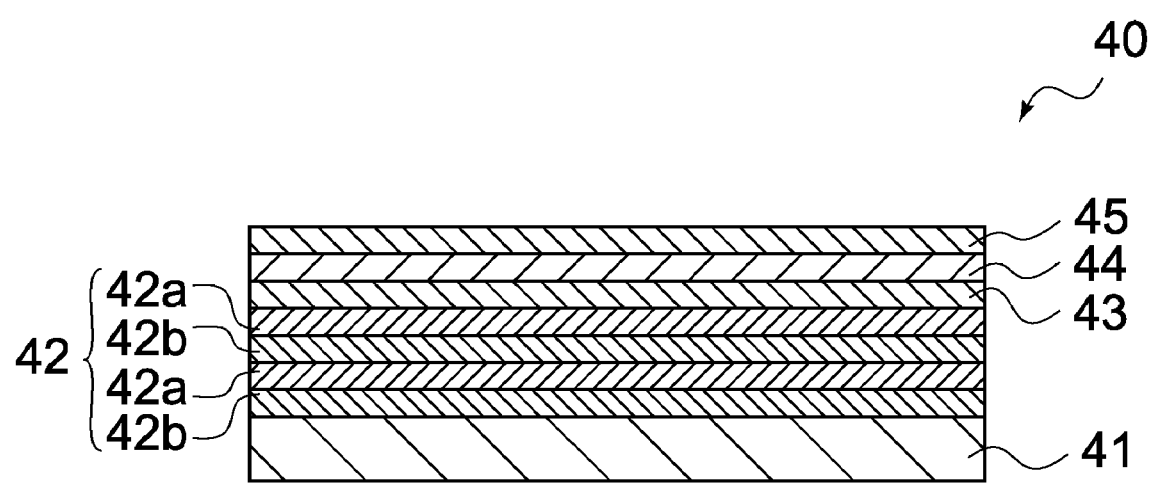
FIG. 10 is a diagram that schematically shows a structure of an SMR device.

Instead of forming a cavity in the lower part of a resonator, some resonator devices have an acoustic multi-layer film below the resonator to cause resonance to occur by utilizing reflections of bulk waves. These resonator devices are referred to as SMRs (solidly mounted resonators). FIG. 10 is a schematic diagram showing a structure of an SMR device 40. The SMR device 40 is made of an acoustic reflective film 42, a lower electrode 43, a piezoelectric layer 44, and an upper electrode 45 laminated in this order on a substrate 41. The acoustic reflective film 42 is made by alternately laminating films 42a having high acoustic impedance and films 42b having low acoustic impedance, each of which has a thickness of ¼ of the wavelength λ of the elastic wave. The basic structure of the resonator part and the vibration mode that is used are similar to those of the FBAR.

Because the resonance frequency of the FBAR (or SMR) is determined by the thickness of a piezoelectric thin film and the acoustic velocity, the resonance frequency can be controlled by the thickness of the piezoelectric thin film. Unlike the Lamb wave device or the SAW device, fine processing of an electrode is not necessary, and therefore, FBAR and SMR devices for a higher frequency range can be obtained with ease. Also, because the very fine electrode is not provided, it is possible to reduce losses and improve power durability. On the other hand, the resonance frequency largely depends on the film thickness, and because it is difficult to control the film thickness in the manufacturing process, the resonance frequency greatly varies due to the manufacturing process, thereby lowering the yield. Also, the manufacturing process itself is more complex as compared with that of the SAW and Lamb wave devices.

In both the Lamb wave device and the FBAR, the Si substrate serves as a supporting substrate. Si is used as the material of the substrate because it is relatively inexpensive and has excellent surface flatness and temperature characteristics, and also because the thin film process on the Si substrate is well-established. Both the Lamb wave device and the FBAR have a piezoelectric thin film, and utilize the vibration in the thickness direction or the plate waves thereof. The piezoelectric thin film cannot stand by itself due to the strength issue or the film stress issue in the case of depositing the film by sputtering.

(Structure of Resonator)

The resonator of an embodiment of the present invention will be explained. FIG. 1 shows a cross-sectional view of the layered structure of the resonator 100. As shown in the figure, the resonator 100 has a supporting substrate 101, a bonding layer 102, a piezoelectric layer 103, and an excitation electrode pair 104. The bonding layer 102 is formed on the supporting substrate 101, the piezoelectric layer 103 is formed on the bonding layer 102, and the excitation electrode pair 104 is formed on the piezoelectric layer 103. The bonding layer 102 has a cavity 105 formed therein. The resonator 100 may further include reflectors, lead-out electrodes, and the like as described below.

The supporting substrate 101 is a substrate to support respective layers formed thereon. There is no special limitation on the material of the supporting substrate 101, and the supporting substrate 101 can be made of Si, Sapphire, AlN, quartz, SiC, or the like. As shown in FIG. 1, the supporting substrate 101 of the resonator 100 is in a flat plate shape, and does not have anything that could cause a reduction in substrate strength (recess structure or the like) formed therein. The thickness of the supporting substrate 101 may be 200 μm, for example, but is not limited to this. The thickness can be set such that the substrate is strong enough to support the layers formed thereabove. The thickness can be made smaller as compared with the case in which the substrate is to be processed.

The bonding layer 102 is formed on the supporting substrate 101, and bonds the supporting substrate 101 and the piezoelectric layer 103 to each other. The bonding layer 102 can be made of a material having adhesiveness such as an acrylic adhesive, an epoxy adhesive, or BCB (benzocyclobutene), for example. It is preferable to use a material that has a significantly lower etch rate for a sacrificial layer remover (hydrofluoric acid or the like), which will be described later, than that of the sacrificial layer.

The bonding layer 102 in a fluid state is disposed between the supporting substrate 101 and the piezoelectric layer 103, and is cured thereafter. When the bonding layer 102 is made of an insulating material, the bonding layer 102 can provide electrical insulation between the supporting substrate 101 and the piezoelectric layer 103. There is no special limitation on the thickness of the bonding layer 102 as long as the thickness is large enough to allow a cavity 105 to be formed. The thickness of the bonding layer 102 may be 1 μm, for example.

The piezoelectric layer 103 is made of a piezoelectric material, and generates bulk acoustic waves. The bulk acoustic waves include film bulk acoustic waves (FBAW) that propagate in the thickness direction of the piezoelectric layer 103 and Lamb waves that propagate as both longitudinal waves and shear vertical waves. In this embodiment, the resonator that utilizes the Lamb waves is explained, but the present invention can also be applied to a resonator that utilizes film bulk acoustic waves.

Unlike surface acoustic waves (SAW) that propagate along the surface of the piezoelectric layer, these bulk acoustic waves need a free vibration surface that allows the piezoelectric layer to vibrate on the side of the piezoelectric layer opposite to the electrodes. In this embodiment, this free vibration surface is provided by the cavity 105 formed on the lower surface of the piezoelectric layer 103 (on the side of the bonding layer 102).

There is no special limitation on the piezoelectric material to form the piezoelectric layer 103, and examples of the material include $LiTaO_3$ single crystals, $LiNbO_3$, AlN, quartz, and a material obtained by doping Fe, Mg, or the like into these materials. The thickness of the piezoelectric layer 103 can be set to about 1 μm, for example. In the piezoelectric layer 103, several penetrating holes 103a are formed. These penetrating holes 103a are used for removing a sacrificial layer, which will be described below.

The excitation electrodes 104 are formed on the piezoelectric layer 103 to excite Lamb waves in the piezoelectric layer 103. The excitation electrodes 104 can be a comb-shaped electrode pair (IDT: inter-digital transducer), each of which is patterned into a comb-like shape, and can be made of Al, Cu, a material obtained by adding Cu to Al, Ti, Ni, Pt, Ru or the like, or a multi-layered film made of these materials, for example. The pattern of the excitation electrodes 104 (such as a comb teeth pitch) can be appropriately selected in accordance with the resonance frequency.

The cavity 105 is formed in the bonding layer 102 to provide a free vibration surface on the lower surface of the piezoelectric layer 103. The cavity 105 is formed on the side of the piezoelectric layer 103 opposite to the excitation electrodes 104 so as to face the excitation electrodes 104 through the piezoelectric layer 103. The cavity 105 can be formed by removing a sacrificial layer, which will be described below. There is no special limitation on the thickness of the cavity 105 as long as the thickness is large enough to allow the vibration of the piezoelectric layer 103. The thickness of the cavity 105 may be 0.5 μm, for example.

(Plan View Configuration of Resonator)

Figure 2:
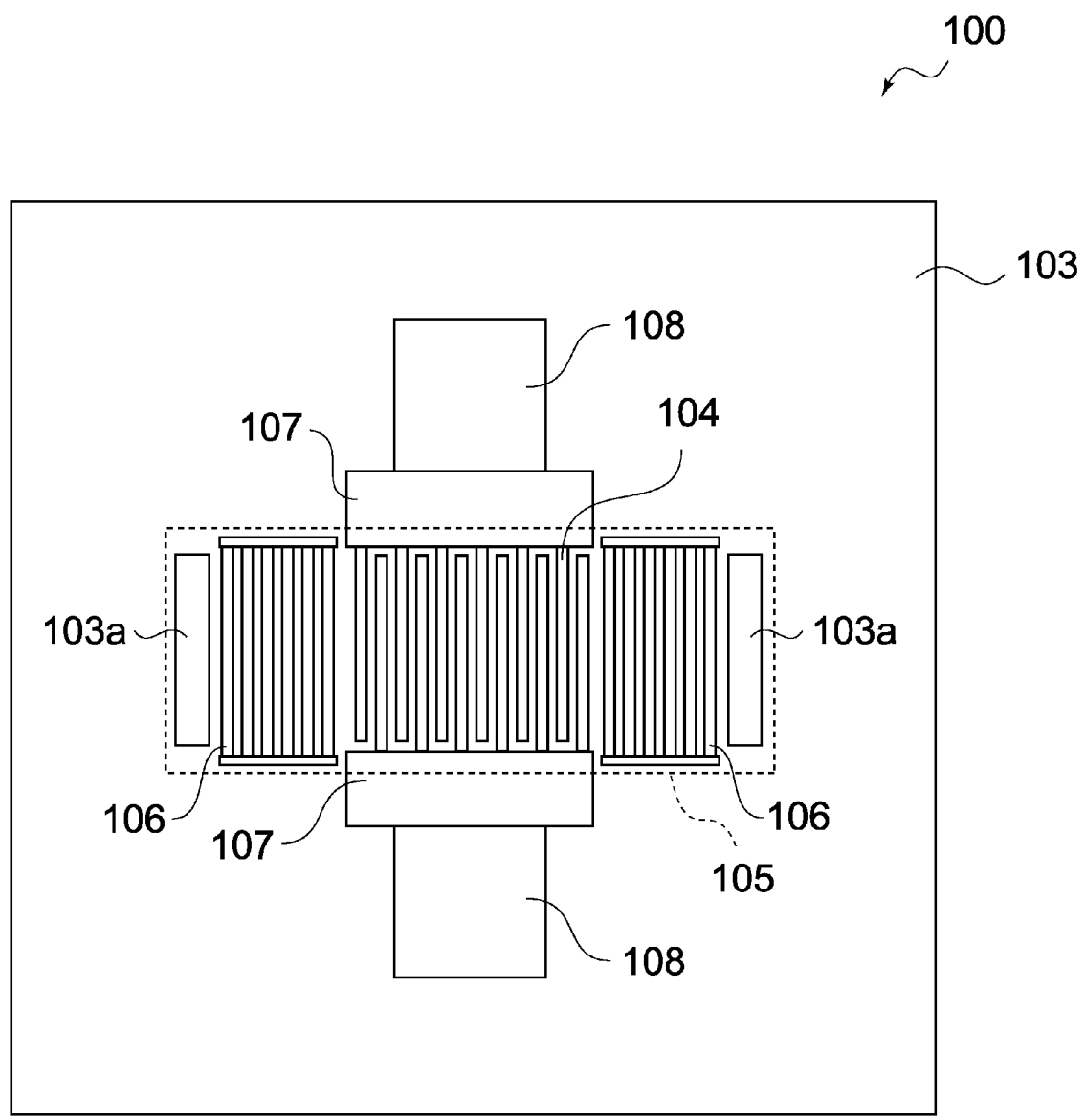
FIG. 2 is a plan view showing a plan view configuration of the resonator.

The plan view configuration of the resonator 100 that has the above-mentioned layered structure will be explained. FIG. 2 is a plan view that shows the resonator 100 when viewed from the upper surface side (excitation electrodes 104 side). As shown in the figure, the resonator 100 includes reflectors 106, lead-out electrodes 107, and mounting pads 108 formed on the piezoelectric layer 103, in addition to the excitation electrodes 104. The layout of the excitation electrodes 104, the reflectors 106, the lead-out electrodes 107, and the mounting pads 108 is not limited to this, and can be appropriately modified.

The reflectors 106 reflect Lamb waves having a specific frequency only, thereby causing the piezoelectric layer 103 to resonate with the excitation electrodes 104. The reflectors 106 can be made of an electrically conductive material that is patterned into a plurality of lines that extend in a direction that intersects with the propagation direction of the Lamb waves. Two reflectors 106 are disposed at both sides of the excitation electrodes 104. The reflectors 106 can be made of the same material as that of the excitation electrodes 104.

The lead-out electrodes 107 are formed integrally with the excitation electrodes 104, and are used to send and receive electrical charges between the excitation electrodes 104 and the mounting pads 108. The mounting pads 108 are pads connected to wiring lines and the like. The lead-out electrodes 107 and the mounting pads 108 can be made of the same material as that of the excitation electrodes 104 and the reflectors 106. Further, the mounting pads 108 may be formed by depositing a metal such as Ti, Ni, Cu, W, Sn, or Au on the same material as that of the excitation electrodes 104 and the reflectors 106.

As shown in FIG. 2, the cavity 105 can be provided on the back side of the excitation electrodes 104 and the reflectors 106. This is because, in this embodiment, Lamb waves propagate between the excitation electrodes 104 and the reflectors 106. If the excitation electrodes 104 and the reflectors 106 are arranged in a manner different from that shown in the figure, the cavity 105 can be formed to cover at least a region in which the Lamb waves propagate.

(Operation of Resonator)

The operation of the resonator 100 will be explained. When the piezoelectric layer 103 is applied with an electric field by the excitation electrodes 104, the piezoelectric layer 103 vibrates as a result of the piezoelectric effect. The vibration of the piezoelectric layer 103 is reflected by the reflectors 106. At this time, the reflectors 106 only reflect Lamb waves having a specific frequency, which varies depending on the pattern of the reflectors 106 (such as a pitch), and the vibration is amplified between the piezoelectric layer 103 and the excitation electrodes 104, thereby causing resonance to occur.

When the Lamb waves reach the excitation electrodes 104, electrical field that corresponds to the distortion caused in the piezoelectric layer 103 due to the reverse piezoelectric effect is induced in the excitation electrodes 104. This electric field causes vibration in the piezoelectric layer 103, which is reflected by the reflectors 106. As a result, the vibration is amplified between the piezoelectric layer 103 and the excitation electrodes 104, thereby causing resonance to occur.

As described above, in the resonator 100, the piezoelectric layer 103 vibrates, thereby resonating with the excitation electrodes 104. In order for the piezoelectric layer 103 to vibrate, it is necessary to provide a free vibration surface on the side of the piezoelectric layer 103 opposite to the excitation electrodes 104. If the free vibration surface is not provided, the vibration of the piezoelectric layer 103 would be restricted, and a function as a resonator would not be achieved or would be degraded. In this embodiment, the cavity 105 is formed on the side of the piezoelectric layer 103 opposite to the excitation electrodes 104, and with this cavity 105, a free vibration surface is provided.

(Manufacturing Method of Resonator)

Figure 3A:
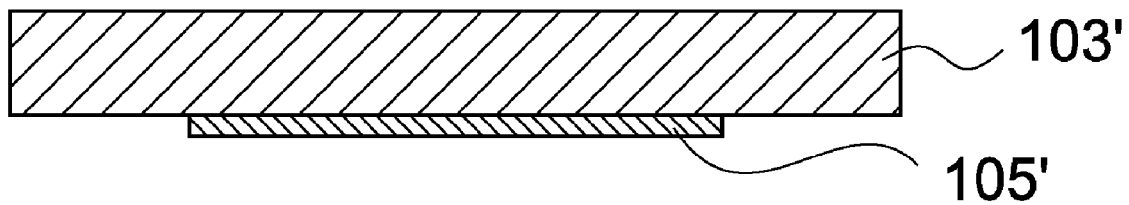
FIGS. 3A to 3E schematically show a manufacturing process of the resonator.

A manufacturing method of the resonator 100 will be explained. FIGS. 3A to 3E schematically show a manufacturing process of the resonator 100. As shown in FIG. 3A, a sacrificial layer 105' is formed on the lower surface of a piezoelectric substrate 103'. The piezoelectric substrate 103' becomes the piezoelectric layer 103 later. The sacrificial layer 105' can be formed by depositing $SiO_2$ to a thickness of 0.5 μm, for example, on the lower surface of the piezoelectric substrate 103' by CVD (Chemical Vapor Deposition), for example. The sacrificial layer 105' can be deposited on the entire lower surface of the piezoelectric substrate 103' first, and can be patterned into a prescribed shape. In this embodiment, as shown in FIG. 2, the sacrificial layer 105' has a larger area than the excitation electrodes 104. Specifically, it is preferable that the sacrificial layer 105' be larger by a margin of 5 μm or greater from the edges of the reflectors 106. The material of the sacrificial layer 105' is not limited to $SiO_2$, and a transparent film made of MgO, ZnO, $TiO_2$, or the like or a metal such as Cu, Ti, or Al may be used.

Figure 3B:
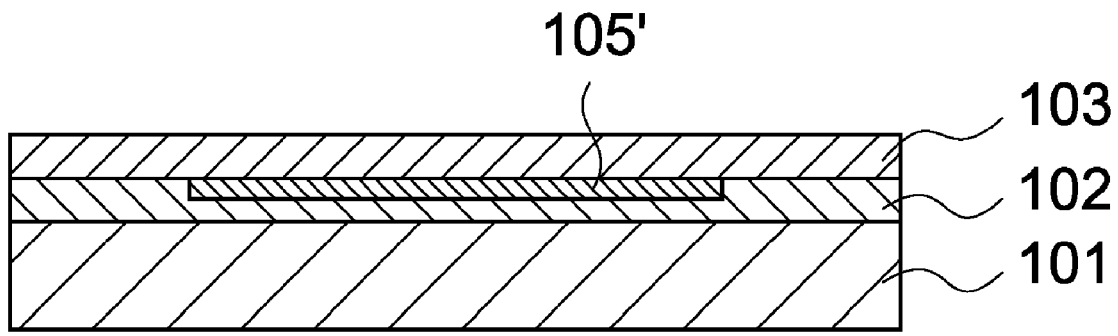

Next, as shown in FIG. 3B, the lower surface of the piezoelectric substrate 103' where the sacrificial layer 105' is formed is bonded to the supporting substrate 101 by an adhesive, which forms the bonding layer 102. The thickness of the bonding layer 102 needs to be at least the same as that of the sacrificial layer 105', and is set to 1 μm, for example. It is preferable that the bonding layer 102 have a UV-curable property similar to that of acryl, epoxy, BCB, or the like. When the supporting substrate 101 is made of Si, for example, the thermal expansion coefficient thereof is 2.6 ppm/° C. When the piezoelectric substrate 103' is made of 42°Y-LT, the thermal expansion coefficient thereof in the X-axis direction is 16.1 ppm/° C. If the bonding layer 102 has a thermosetting property, due to the difference in thermal expansion coefficient between the supporting substrate 101 and the piezoelectric substrate 103', the substrate is caused to warp after bonding. This warping may prevent the substrate from being transferred or processed properly in the manufacturing steps. For this reason, it is preferable that the bonding layer 102 have a UV-curable property. Because the sacrificial layer 105' is formed on the piezoelectric substrate 103' in advance, the adhesive need not be interposed between the piezoelectric layer 103 and the sacrificial layer 105'. Next, the piezoelectric layer 103 is thinned to a desired thickness by grinding, polishing or the like. For example, the thickness of the piezoelectric layer 103 is reduced from 250 μm to 1 μm.

Figure 3C:
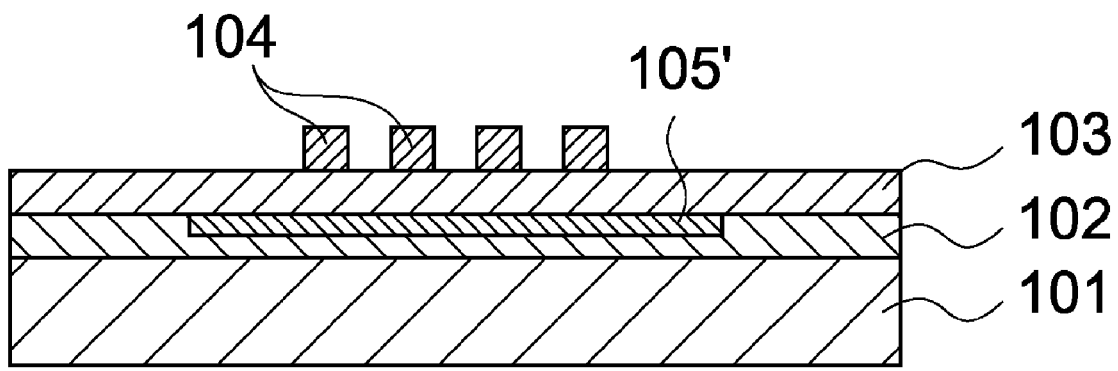

Next, as shown in FIG. 3C, the excitation electrodes 104 are formed on the upper surface of the piezoelectric layer 103. The excitation electrodes 104 can be formed by depositing an electrode material on the piezoelectric layer 103, and patterning the deposited layer by dry-etching or the like. For example, the excitation electrodes 104 can be made of Al with 1% Cu, and the thickness thereof can be set to 0.2 μm. In order to improve the adhesion and power durability, a Ti film or the like can be formed under the layer made of Al with 1% Cu. Also, in this step, the reflectors 106, the lead-out electrodes 107, and the mounting pads 108 can be simultaneously formed by patterning.

Figure 3D:
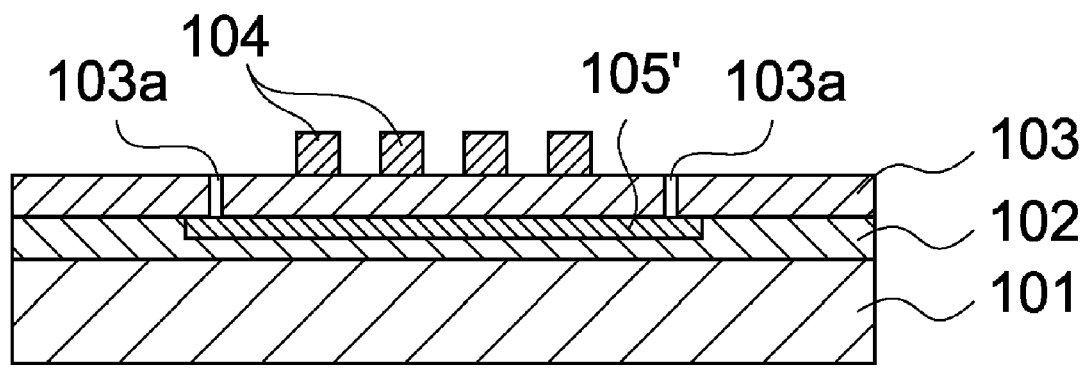

Next, as shown in FIG. 3D, penetrating holes 103a are formed in the piezoelectric layer 103. The penetrating holes 103a can be formed by dry-etching or the like. The depth thereof can be set to 1 μm, which is the same as the thickness of the piezoelectric layer 103. As the etching apparatus, a plasma etching apparatus (NLD made by ULVAC, Inc.) is used, and as the etching gas, a mixture gas of $C_3F_8$ and Ar is used. There is no special limitation on the etching conditions, but for example, the high-frequency power to form plasma is set to 600 W, the substrate bias is set to 300 W, the processing pressure is set to 0.66 Pa, and the etching gas flows are set to 80 sccm for Ar and 20 sccm for $C_3F_8$. As shown in FIG. 2, the penetrating holes 103a are formed outside of the reflectors 106. In order to prevent the piezoelectric layer 103 from being damaged in the subsequent step of removing the sacrificial layer, it is preferable that the penetrating holes 103a be formed within the region of the sacrificial layer 105'. For example, a space between the penetrating hole 103a and the sacrificial layer 105' and a space between the reflector 106 and the penetrating hole 103a can be respectively set to 1 μm or greater. However, there is no limitation on the location of the penetrating holes, and it is also possible to dispose the penetrating holes in a circular shape at the four corners of the sacrificial layer 105'. The shape of the penetrating holes is not limited to a particular shape, and may be square, rectangle, circle, triangle, or the like. Also, there is no special limitation on the quantity thereof.

Figure 3E:
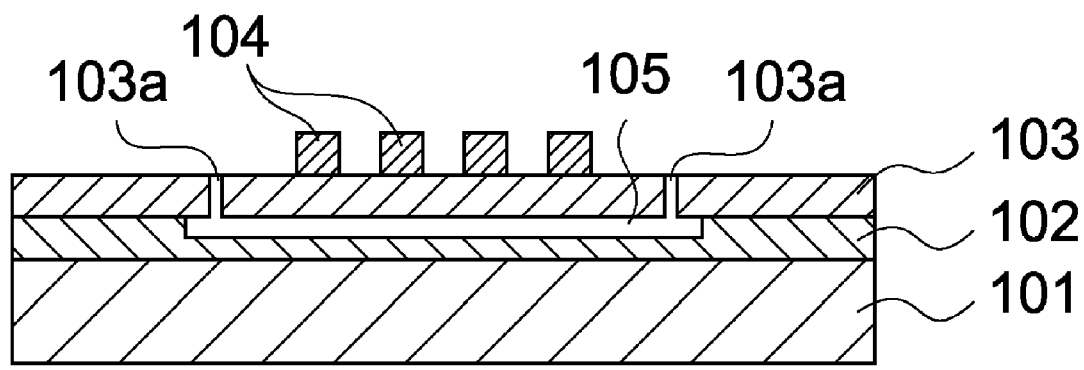

Next, as shown in FIG. 3E, a sacrificial layer remover is injected into the penetrating holes 103a, thereby removing the sacrificial layer 105'. As the sacrificial layer remover, a solution that can dissolve the material of the sacrificial layer 105' and that does not dissolve the material of the bonding layer 102 is used, and for example, hydrogen fluoride can be used. When the sacrificial layer 105' is removed by the sacrificial layer remover, a cavity 105 is formed. This way, the resonator 100 is manufactured. When the sacrificial layer 105' is made of $SiO_2$, the sacrificial layer 105' is removed by 1% hydrofluoric acid. The etch rate of the bonding layer 102 to 1% hydrofluoric acid is lower than that of $SiO_2$, and therefore, only the sacrificial layer 105' made of $SiO_2$ is selectively dissolved, resulting in the cavity 105. In a step of drying the substrate, which is conducted after removing the sacrificial layer, the piezoelectric layer 103 having a hollow is likely to stick to the bonding layer 102 provided therebelow, causing a sticking defect. In order to avoid this defect, it is preferable that the thickness of the sacrificial layer 105' be 0.5 μm or greater. The substrate is soaked in an organic solvent such as acetone or IPA, and is dried thereafter.

As described above, in this embodiment, the free vibration surface of the piezoelectric layer 103 can be formed without processing the supporting substrate 101, and therefore, it is possible to prevent a reduction in strength of the supporting substrate as a result of the processing. Generally, when an Si substrate, which becomes the supporting substrate, is processed, D-RIE (deep-reactive ion etching) or the like is used as the processing method. However, in this embodiment, such processing is not necessary, thereby eliminating the need for equipment, and reducing the manufacturing time, cost, and the like.

Further, as described above, because the sacrificial layer 105' is deposited on the piezoelectric substrate 103' before bonding the piezoelectric substrate 103' to the supporting substrate 101 by an adhesive, it is possible to prevent the adhesive from being adhered to the lower surface of the piezoelectric layer 103 facing the cavity 105. If the adhesive is adhered to this surface, the resonance characteristics of the piezoelectric layer 103 can be affected by the presence of the adhesive. On the other hand, in this embodiment, it is possible to eliminate the effect of the adhesive.

(Configuration of Frequency Filter)

Figure 4:
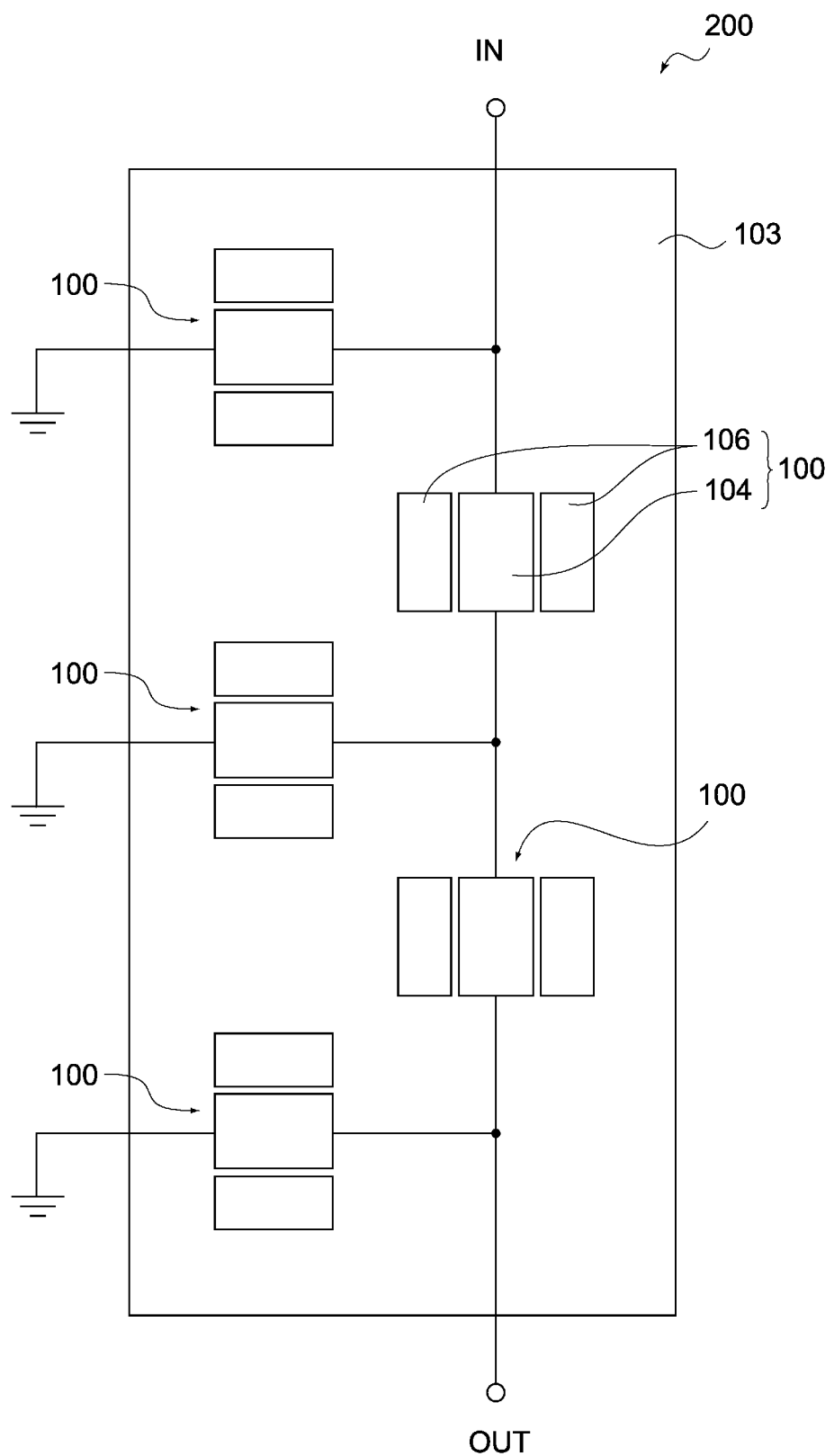
FIG. 4 is a diagram that schematically shows a frequency filter of an embodiment of the present invention.

A frequency filter can be obtained by using the resonator 100 having the configuration described above. FIG. 4 is a schematic diagram showing a configuration of a frequency filter 200. As shown in the figure, the frequency filter 200 is constituted of a plurality of resonators 100 connected to each other, each of which includes the excitation electrode pair 104 and the reflectors 106. The frequency filter 200 shown in FIG. 4 is a filter referred to as a ladder filter, but the present invention can also be applied to filters having other configurations such as a DM (double mode) filter.

Figure 11:
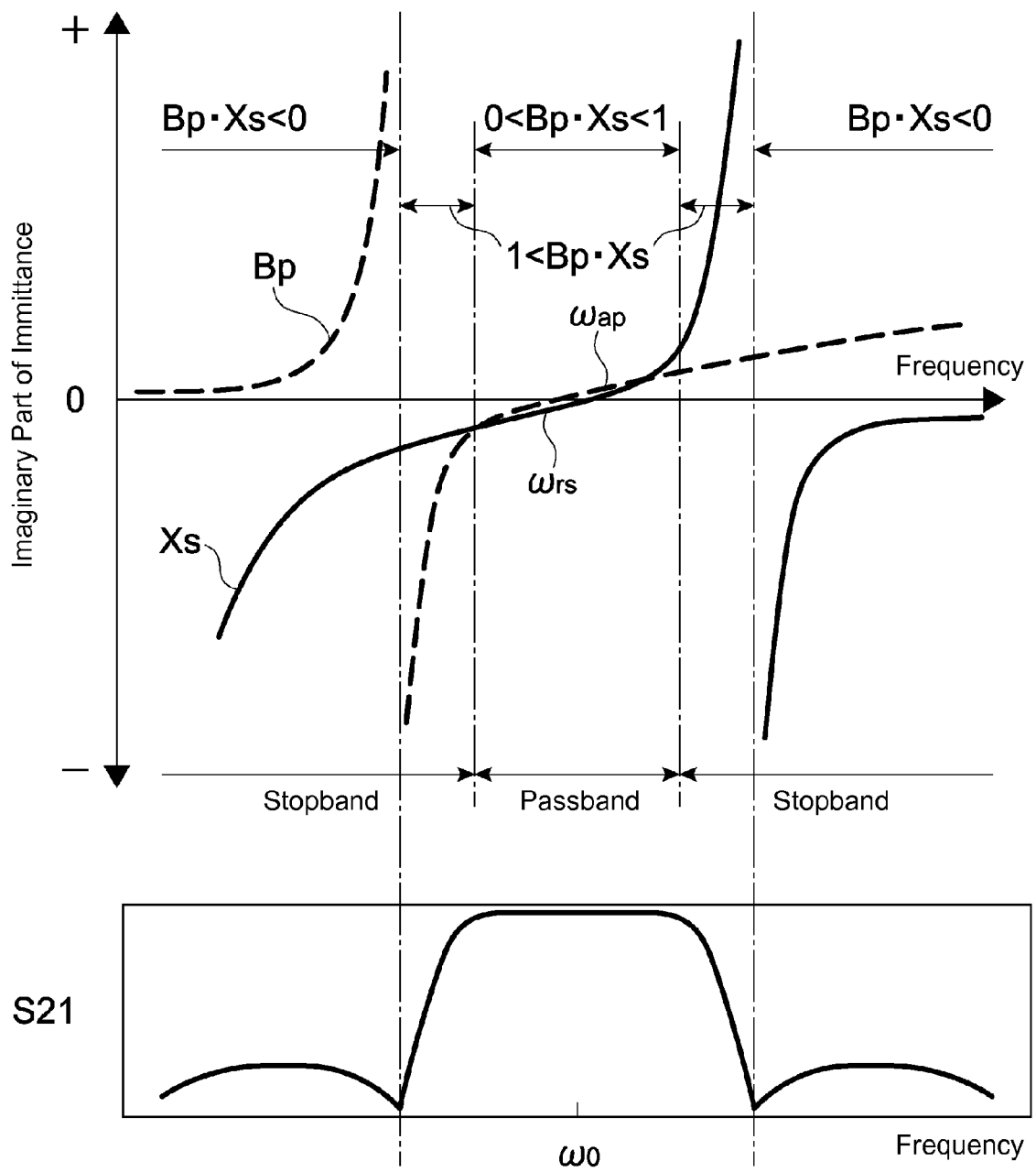
FIG. 11 is a graph showing impedance characteristics of a series resonator and a parallel resonator.

The ladder filter will be further explained below. The ladder filter has a structure in which resonators are connected in series and in parallel. FIG. 11 is a graph showing impedance characteristics of series resonators, which are connected in series, and parallel resonators, which are connected in parallel. The vertical axis of FIG. 11 is represented as "immittance." This is because this graph shows both the impedance and admittance, and the term "immittance" is used to refer to the impedance and admittance collectively. In FIG. 11, Bp represents the imaginary part of the admittance of the parallel resonator, and Xs represents the imaginary part of the impedance of the series resonator. The mechanism and configuration of the ladder filter are as follows.

First, the zero of the impedance of the series resonator Rs and the pole of the impedance of the parallel resonator Rp are made to coincide with each other ($\omega ap$ and $\omega rs$). The pole frequency of an attenuation pole that meets specifications is determined (see FIG. 11). Next, a configuration of the resonator that realizes desired passband characteristics is determined. For example, in the case of a SAW filter, the overlap length and logarithm (number of overlapping pairs) of electrodes and the like are determined. The resonator is configured such that the impedance Zin of the filter is infinite in the attenuation band, and is 50Ω in the passband.

The layered structure of the frequency filter 200 can be similar to that of the resonator 100 described above, that is, the piezoelectric layer 103 is formed on a single supporting substrate 101 through the bonding layer 102, and the respective excitation electrodes 104 and reflectors 106 are formed thereon. The cavity 105 is formed on the lower surface side of each resonator 100 as shown in FIG. 2.

The frequency filter 200 serves as a broadband pass filter. As described above, because the supporting substrate 101 does not undergo any processing that could reduce the strength thereof, it is possible to achieve a frequency filter with high strength and high productivity.

(Configuration of Electronic Device and Duplexer)

A duplexer of an electronic device can be configured by using the frequency filter 200 described above. A duplexer is a device that allows a single antenna to serve as both a transmission antenna and a reception antenna. The duplexer needs to be configured to minimize leak of transmission signals to a reception range, and leak of reception signals to a transmission range. In order to fulfill these requirements, the impedance Zt of the transmission filter and the impedance Zr of the reception filter need to be set so as to meet the conditions shown in the table in FIG. 12. In this table, Z0=50Ω.

Figure 5:
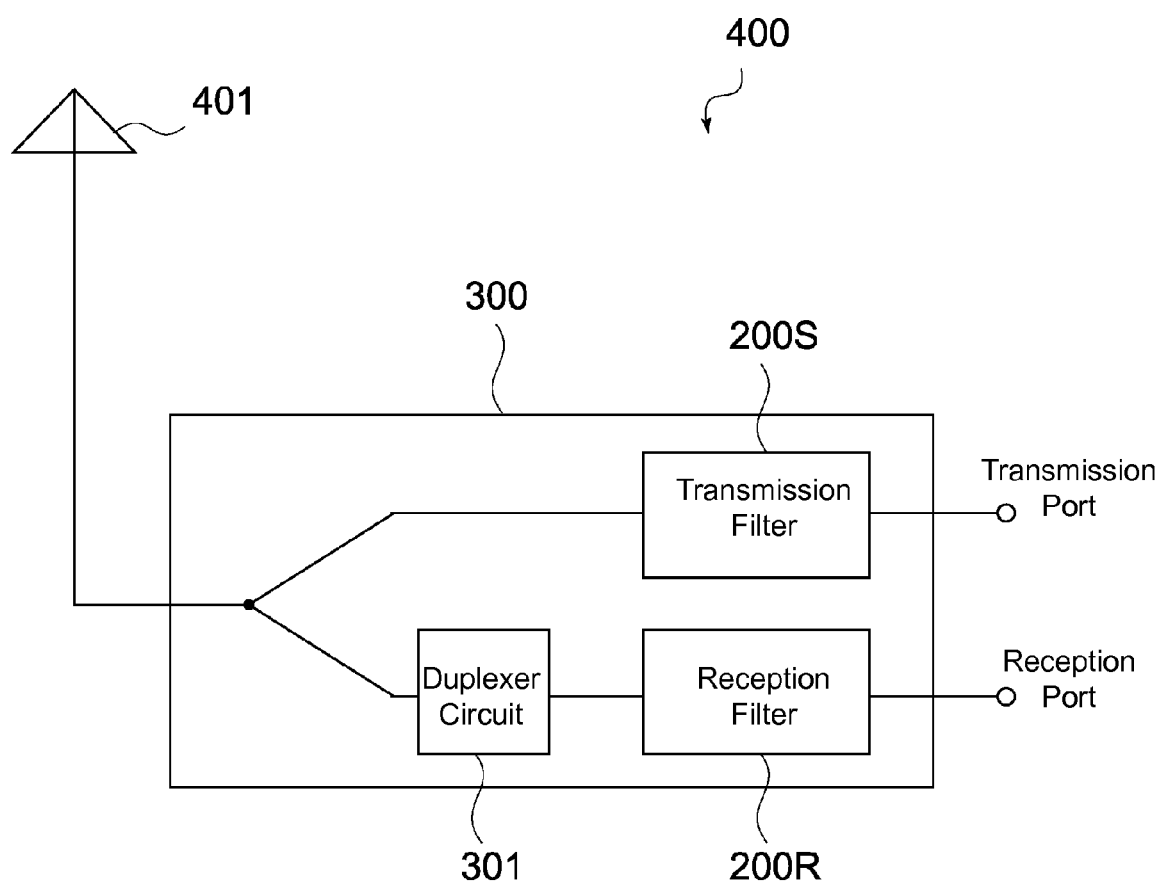
FIG. 5 is a diagram that schematically shows an electronic device and a duplexer of an embodiment of the present invention.

FIG. 5 is a schematic diagram showing a configuration of an electronic device 400 that is equipped with a duplexer 300. The electronic device 400 is an electronic device that can send and receive wireless signals such as a mobile phone or a transceiver.

As shown in the figure, the electronic device 400 has a duplexer 300 and an antenna 401. The antenna 401 is connected to the duplexer 300, and the duplexer 300 is connected to a transmission port and a reception port that are provided in the electronic device 400.

The duplexer 300 has a transmission filter 200S, a reception filter 200R, and a duplexer circuit 301. The transmission filter 200S and the reception filter 200R are both connected to the antenna 401, and the duplexer circuit 301 is disposed between the antenna 401 and the reception filter 200R. The transmission filter 200S is connected to the transmission port, and the reception filter 200R is connected to the reception port, respectively.

The frequency filter 200 described above can be used as each of the transmission filter 200S and the reception filter 200R. The passband of the transmission filter 200S is set to be a transmission frequency range, and the passband of the reception filter 200R is set to be a reception frequency range. The transmission filter 200S and the reception filter 200R can also be provided on a single supporting substrate.

The duplexer circuit 301 isolates a signal from signals of respective frequency ranges that share a single signal line and outputs the isolated signal without causing disturbance in the impedance. The antenna 401 is a shared antenna that is used for both transmission and reception of the wireless signals, and there is no special limitation on the configuration thereof.

The reception signal that was received by the antenna 401 is supplied to the transmission port through the reception filter 200R, but because the signal is blocked at the transmission filter 200S, the signal is prevented from reaching the transmission port. On the other hand, the transmission signal supplied from the transmission port is sent to the antenna 401 through the transmission filter 200S, but because the signal is blocked at the reception filter 200R, the signal is prevented from reaching the reception port. As described above, by using the duplexer 300, the antenna 401 can be used for both transmission and reception.

The present invention is not limited to the above embodiments, and modifications can be made without departing from the scope of the technique disclosed herein.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A resonator, comprising:
   a supporting substrate;
   a piezoelectric layer made of a piezoelectric material;
   a pair of excitation electrodes that is formed on an upper surface of the piezoelectric layer, the pair of excitation electrodes being provided to excite bulk acoustic waves in the piezoelectric layer; and
   a bonding layer that has a cavity formed therein so as to face the pair of excitation electrodes through the piezoelectric layer, the bonding layer being provided to bond the supporting substrate to a lower surface of the piezoelectric layer,
   wherein said cavity starts from a top of the bonding layer and does not penetrate through a bottom of the bonding layer.

2. The resonator according to claim 1, wherein the bulk acoustic waves are Lamb waves.

3. The resonator according to claim 1, wherein the bonding layer is made of an insulating material.

4. The resonator according to claim 1, wherein the pair of excitation electrodes is an IDT.

5. A frequency filter, comprising:
   a supporting substrate;
   a piezoelectric layer made of a piezoelectric material;
   a plurality of pairs of excitation electrodes that are formed on an upper surface of the piezoelectric layer, the plurality of pairs of excitation electrodes being provided to excite bulk acoustic waves in the piezoelectric layer; and
   a bonding layer that has a cavity formed therein so as to face each of the pairs of excitation electrodes through the piezoelectric layer, the bonding layer being provided to bond the supporting substrate to a lower surface of the piezoelectric layer,
   wherein said cavity starts from a top of the bonding layer and does not penetrate through a bottom of the bonding layer.

6. A duplexer, comprising:
   a transmission filter that comprises: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the transmission filter being connected to an antenna and to a transmission port, wherein said cavity starts from a top of the bonding layer and does not penetrate through a bottom of the bonding layer; and
   a reception filter that comprises: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the reception filter being connected to the antenna and to a reception port, wherein said cavity starts from a top of the bonding layer and does not penetrate through a bottom of the bonding layer.

7. An electronic device, comprising:
   an antenna;

a transmission filter that comprises: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the transmission filter being connected to the antenna and to a transmission port, wherein said cavity starts from a top of the bonding layer and does not penetrate through a bottom of the bonding layer; and a reception filter that comprises: a supporting substrate; a piezoelectric layer made of a piezoelectric material; a plurality of pairs of excitation electrodes that are formed on an upper surface of the piezoelectric layer, the plurality of pairs of excitation electrodes being provided to excite bulk acoustic waves in the piezoelectric layer and at least some of the excitation electrodes being connected to each other; and a bonding layer that has a cavity formed therein so as to face each of the pairs of excitation electrodes through the piezoelectric layer, the bonding layer being provided to bond the supporting substrate to a lower surface of the piezoelectric layer, the reception filter being connected to the antenna and to a reception port, wherein said cavity starts from a top of the bonding layer and does not penetrate through a bottom of the bonding layer.

* * * * *